US009196719B2

(12) United States Patent
Lai et al.

(10) Patent No.: US 9,196,719 B2
(45) Date of Patent: Nov. 24, 2015

(54) ESD PROTECTION CIRCUIT

(71) Applicant: GLOBALFOUNDRIES Singapore Pte. Ltd., Singapore (SG)

(72) Inventors: Da-Wei Lai, Singapore (SG); Ming Li, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 13/967,372

(22) Filed: Aug. 15, 2013

(65) Prior Publication Data

US 2014/0264556 A1    Sep. 18, 2014

Related U.S. Application Data

(60) Provisional application No. 61/781,265, filed on Mar. 14, 2013.

(51) Int. Cl.
| | | |
|---|---|---|
| H01L 29/76 | (2006.01) | |
| H01L 29/94 | (2006.01) | |
| H01L 31/062 | (2012.01) | |
| H01L 31/113 | (2006.01) | |
| H01L 31/119 | (2006.01) | |
| H01L 29/78 | (2006.01) | |
| H01L 27/02 | (2006.01) | |

(52) U.S. Cl.
CPC .............. *H01L 29/78* (2013.01); *H01L 27/0277* (2013.01)

(58) Field of Classification Search
CPC ............ H01L 29/7816; H01L 27/0248; H01L 29/66681; H01L 29/78; H01L 27/0277
USPC ........... 257/328, 355, 173, E29.256, E29.255
See application file for complete search history.

(56) References Cited

U.S. PATENT DOCUMENTS

| | | | |
|---|---|---|---|
| 2009/0261417 A1* | 10/2009 | Jou et al. ........................ | 257/355 |
| 2013/0093010 A1* | 4/2013 | Huang et al. ................... | 257/335 |
| 2013/0134511 A1* | 5/2013 | Yang et al. ..................... | 257/339 |

FOREIGN PATENT DOCUMENTS

| | | |
|---|---|---|
| TW | I242847 B | 11/2005 |
| TW | I284975 B | 8/2007 |
| TW | 200908812 A | 2/2009 |
| TW | 201126691 A | 8/2011 |
| TW | 201201346 A | 1/2012 |

* cited by examiner

*Primary Examiner* — Thien F Tran
(74) *Attorney, Agent, or Firm* — Horizon IP Pte. Ltd.

(57) ABSTRACT

A device having a substrate defined with a device region is presented. The device region includes an ESD protection circuit having a transistor. The transistor includes a gate having first and second sides, a first diffusion region disposed adjacent to the first side of the gate and a second diffusion region displaced away from the second side of the gate. The device includes a first device well encompasses the device region and a second device well disposed within the first device well. The second device well encompasses the first diffusion region and at least a part of the gate. The device also includes a third well which is disposed within the second device well and a drain well which encompasses the second diffusion region and extends below the gate.

20 Claims, 3 Drawing Sheets

ESD PROTECTION CIRCUIT

BACKGROUND

Traditional lateral diffused metal oxide semiconductor (LDMOS) which is used as ESD protection device in high voltage processes has some inherent poor characteristics, such as "strong snapback effect or base push out", which negatively affect or degrade its ESD performance. These negative characteristics affect the operation of the integrated circuit (IC) rendering it defective.

The disclosure is directed to a compact ESD protection device with robust ESD performance to avoid damaging internal circuits and at the same time having high latch up immunity.

SUMMARY

Embodiments generally relate to semiconductor devices. In one embodiment, a device is disclosed. The device includes a substrate defined with a device region. The device region includes an ESD protection circuit having a transistor. The transistor includes a gate having first and second sides, a first diffusion region adjacent to the first side of the gate and a second diffusion region displaced away from the second side of the gate. The first and second diffusion regions include dopants of a first polarity type. The device includes a first device well which encompasses the device region and a second device well which is disposed within the first device well. The second device well encompasses the first diffusion region and at least a part of the gate without encompassing the second diffusion region. The device further includes a third well disposed within the second device well and a drain well which encompasses the second diffusion region and extends below the gate.

In another embodiment, a device having a substrate defined with a device region is presented. The device region includes an ESD protection circuit having a transistor. The transistor includes a gate having first and second sides, a first diffusion region disposed adjacent to the first side of the gate and a second diffusion region displaced away from the second side of the gate. The device includes a first device well encompasses the device region and a second device well disposed within the first device well. The second device well encompasses the first diffusion region and at least a part of the gate. The device also includes a third well which is disposed within the second device well and a drain well having dopants of a first polarity type which encompasses the second diffusion region and extends below the gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. ESD circuits are provided for the devices. For example, the ESD circuits may be used in high voltage applications or devices. The ESD circuits, for example, may be used in 8~12V applications.

The ESD circuits as will be described below, are suitable for use in, for example, devices produced under the 0.18 μm 12V Bipolar CMOS DMOS (BCD) process. Other suitable types of processes may also be useful. ESD circuits, for example, are activated during an ESD event to dissipate ESD current. The devices, for example, may be any type of semiconductor devices, such as integrated circuits (ICs). Such devices, for example, can be incorporated into standalone devices or ICs, such as microcontrollers or system on chips (SoCs). The devices or ICs can be incorporated into or used with, for example, electronic products, such as speakers, computers, cell phones, and personal digital assistants (PDAs).

Figure 1A:
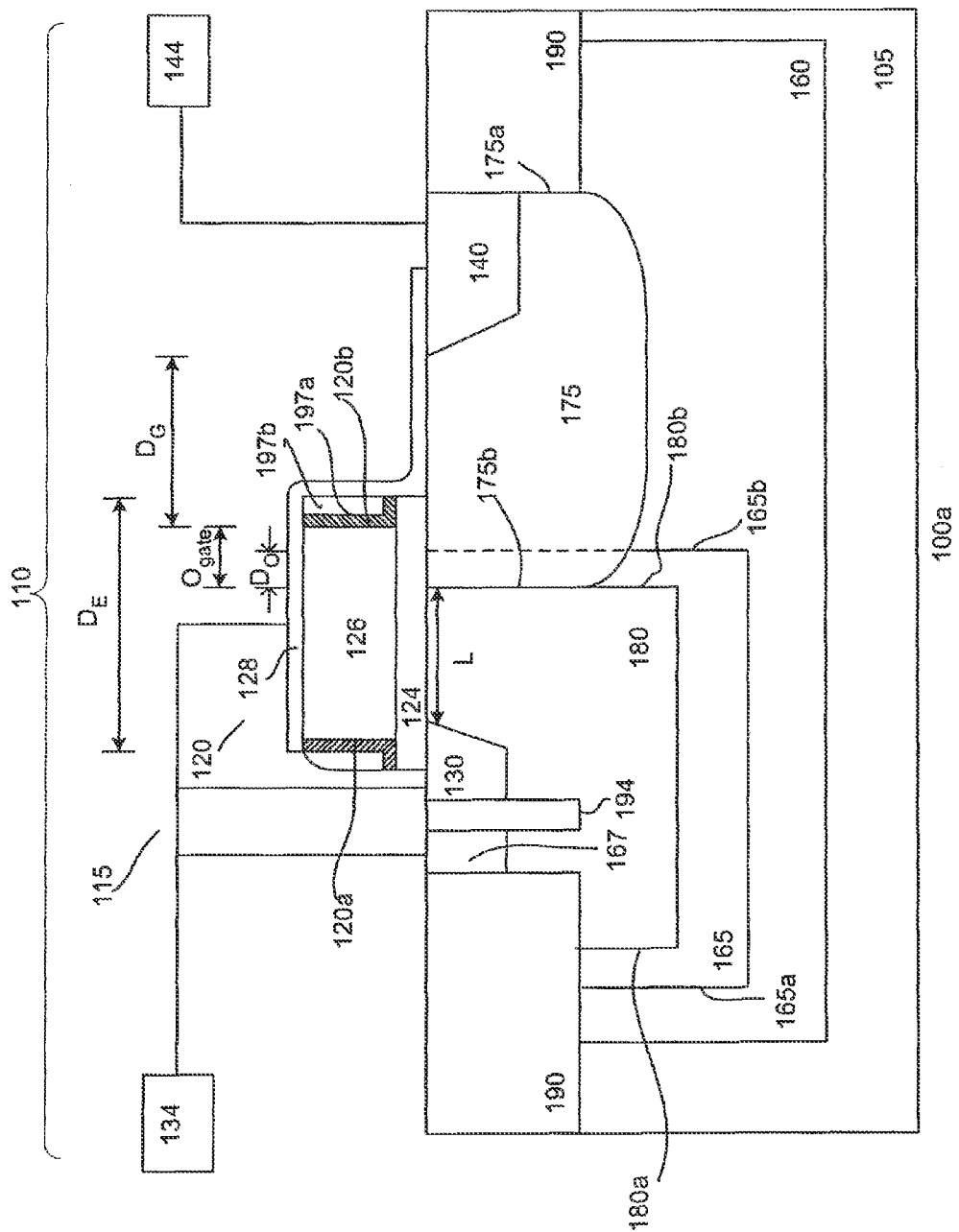
FIGS. 1a-b show cross-sectional views of various embodiments of a device.
Figure 1B:
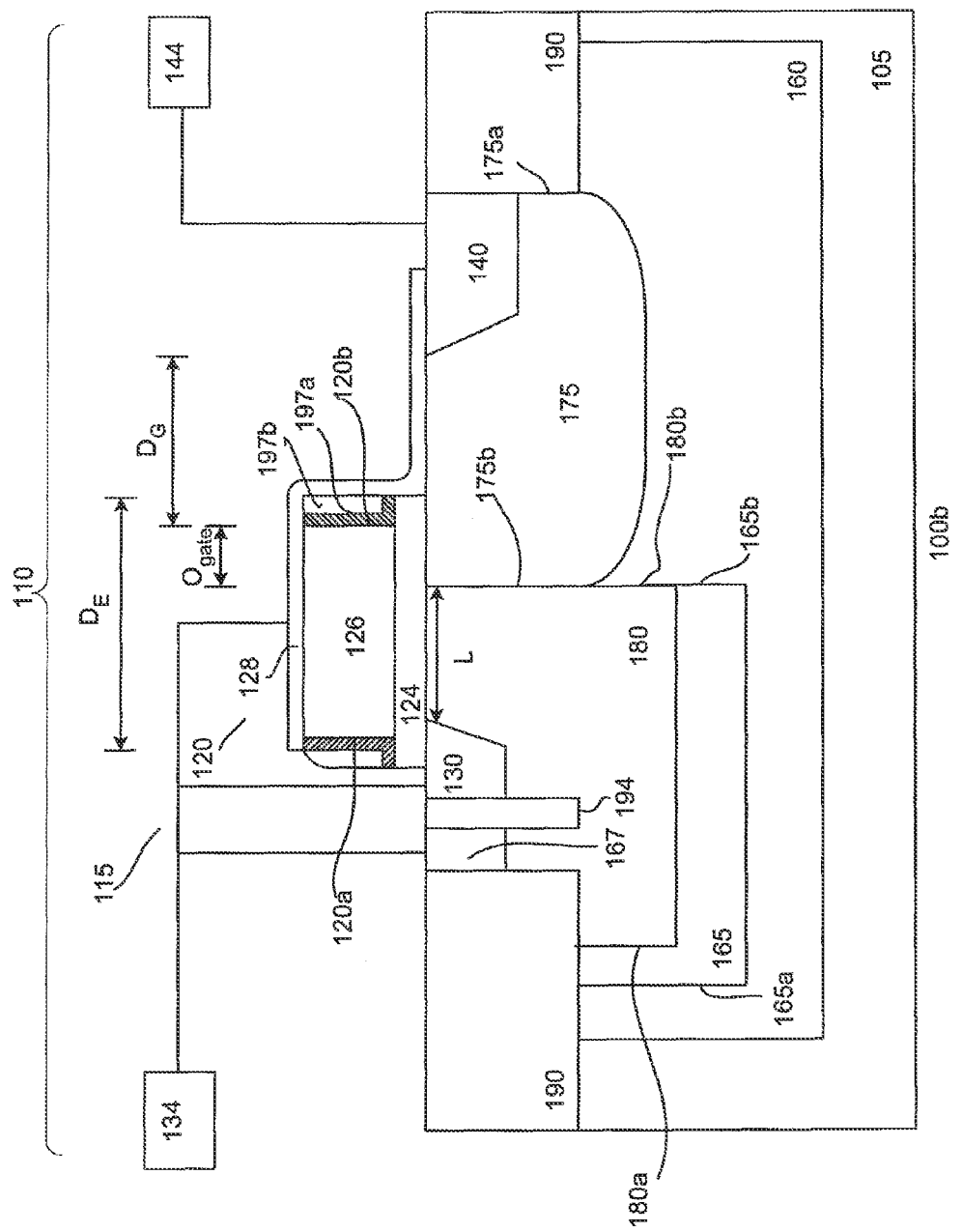

FIGS. 1a-b show cross-sectional views of various embodiments of a device 100a-b. As shown, a substrate 105 is provided. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates, including doped with other types of dopants or concentration or undoped, may also be useful. For example, the substrate may be a silicon germanium, germanium, gallium arsenide, or crystal-on-insulator (COI) such as silicon-on-insulator (SOI). The substrate can be a doped substrate.

The device may include doped regions or wells having different dopant concentrations. For example, the device may include heavily doped, intermediate doped and lightly doped regions. The doped regions may be designated by $x^-$, $x$ and $x^+$, where x indicates the polarity of the doping, such as p for p-type or n for n-type, and:

$x^-$=lightly doped;
x=intermediately doped; and
$x^+$=heavily doped.

A lightly doped region may have a dopant concentration of less than about $5E13/cm^3$. For example, a lightly doped region may have a dopant concentration of about $1E11/cm^3$-$5E13/cm^3$. An intermediate doped region may have a dopant concentration from about $5E13$-$5E15/cm^3$. For a heavily doped region, it may have a dopant concentration of more than about $5E15/cm^3$. For example, a heavily doped region may have a dopant concentration from about $5E15\,cm^3$-$9E15/cm^3$. Other concentrations of the different types of doped regions may also be useful. P-type dopants may include boron (B), aluminum (Al), indium (In) or a combination thereof, while n-type dopants may include phosphorus (P), arsenic (As), antimony (Sb) or a combination thereof.

As shown, the device includes a device region 110 defined on the substrate. The substrate may also include regions for other types of circuitry, depending on the type of device or IC. For example, the device may also include regions (not shown) for intermediate voltage (IV) and low voltage (LV) devices as well as an array region for memory devices. A device isolation region 190 may be provided for isolating or separating the device region from other device regions (not shown) on the substrate. In one embodiment, the device isolation region surrounds the device region. The isolation region, for example, is a shallow trench isolation (STI) region. Other types of isolation regions may also be employed. For example, the isolation region may be a deep trench isolation (DTI) region. The isolation region, for example, extends to a depth of about 3200 Å for a STI region. Providing isolation regions which extend to other depths, such as 0.5-10 μm for DTI regions, may also be useful. In one embodiment, the width of the isolation region is about 0.3 μm. Providing isolation regions having different depths and widths may also be useful. The dimensions, for example, may depend on isolation requirements The device region includes an ESD protection circuit 115. The ESD protection circuit, in one embodiment, is a lateral diffused transistor. For example, the ESD protection circuit is a lateral diffused metal oxide semiconductor (LDMOS) transistor. As shown, the device region includes one LDMOS transistor. Providing more than one LDMOS transistors may also be useful.

A first doped well 160 is disposed in the substrate in the device region. The first doped well, as shown, encompasses the complete device region. For example, the first doped well serves as a first device well which extends from the bottom of the isolation region between the inner and outer edges of the isolation region. Providing the first doped well which extends from about an outer edge of the device isolation region 190 may also be useful. In one embodiment, the first doped well serves as an isolation well. For example, the first well isolates the ESD protection circuit from the substrate. The first doped well should be sufficiently deep to serve as an isolation well. The depth of the first doped well, for example, may be about 4~10 μm. Other suitable depth dimensions may also be useful.

The first doped well includes first polarity type dopants. In one embodiment, the first well is lightly doped with first polarity type dopants. For example, the dopant concentration of the first doped well may be about $1E12$~$5E13/cm^3$. Providing a first doped well having other dopant concentrations may also be useful. In one embodiment, the first polarity type is n-type. For example, the first well may be n⁻ well for n-type device. Providing p-type as the first polarity type is also useful. For example, a p⁻ well may be used for a p-type device.

A gate 120 of the transistor is disposed on the surface of the substrate in the device region. A gate may be referred to as a finger. The gate includes a gate electrode 126 disposed over a gate dielectric 124. In one embodiment, the gate electrode is a polysilicon gate electrode. Other suitable types of gate electrode materials may also be useful. As for the gate dielectric, it includes a silicon oxide. Other suitable types of gate dielectric materials may also be useful. In one embodiment, the gate is similar to gates used for medium voltage devices. For example, the thicknesses of the gate electrode and gate dielectric may be similar to that of the medium voltage devices. The thickness of the gate electrode, for example, is about 2000 Å while the thickness of the gate dielectric, for example, is about 130 Å. Other configurations of gates may also be useful.

The gate may be a gate conductor which forms gates of multiple transistors. For example, the gate conductor may traverse a plurality of device regions separated by isolation regions. The pluralities of transistors have a common gate formed by the gate conductor. Other configurations of gate conductors may also be useful.

The gate is disposed between first and second source/drain (S/D) regions 130 and 140. The S/D regions are first polarity type doped regions disposed in the substrate. The S/D regions are, for example, heavily doped first polarity type regions. For example, the S/D regions may have a depth of about 0.1-0.4 μm. Other suitable depths may also be useful. The S/D regions may be similar to those of other transistors of the device. In one embodiment, the first S/D region 130 is a source region and the second S/D region 140 is a drain region of the transistor.

The first S/D region 130 is disposed adjacent to a first side 120a of the gate. In one embodiment, the gate overlaps the first S/D region 130. For example, the first side of the gate overlaps the first S/D region. The amount of overlap should be sufficient for the first S/D region to be in communication with a channel of the transistor under the gate. The amount of overlap is, for example, about 0.1-0.5 μm. Overlapping the first S/D region by other amounts may also be useful. In one embodiment, the gate overlaps a lightly doped (LD) region of the first S/D region. Other configurations of the first S/D region may also be useful. As for the second S/D region 140, it is displaced by a distance $D_G$ laterally away from a second side 120b of the gate. The lateral displacement $D_G$ may, in some instances, correspond to the drift distance. $D_G$, for example, may be about 1~10 μm. $D_G$, for example, may include any other suitable distances which depend on general design rules of respective foundries.

Sidewalls of the gate may be provided with dielectric spacers. The dielectric spacers, for example, may be silicon oxide spacers. Other types of dielectric materials may also be useful, such as silicon nitride or a combination of dielectric materials or layers. For example, the spacers may be composite spacers 197a-b as shown in FIGS. 1a-b. The spacers may facilitate forming the lightly doped and S/D regions. For example, the lightly doped region is formed prior to spacer formation while the first S/D region is formed after spacer formation. Other configurations of spacers may also be useful. For example, the spacer may be a single spacer. In some cases, the transistor may also include a halo region. The halo region is a second polarity doped region abutting the lightly doped and first S/D regions under the gate.

In one embodiment, no drift isolation region is provided between the gate and the second S/D region. For example, as shown in FIGS. 1a-b, the transistor is devoid of a drift isolation region. Without the drift isolation region, the ESD device trigger voltage may be reduced to a lower voltage about, for example, 15V. In the case where no drift isolation region is provided, a silicide block 128 is provided on the substrate. The silicide block prevents formation of silicide to reduce risk of shorting of the silicide contact (not shown) on the drain region from shorting with the gate. The silicide block is a dielectric liner. For example, the dielectric liner is a silicon oxide liner. In one embodiment, the silicide block is disposed on a top surface of the gate, overlapping the gate by a distance $D_E$. The distance $D_E$, for example, is equal to about the length of the gate. $D_E$, for example, may also include any other suitable distances which depend on general design rules of respective foundries. Providing a portion of the silicide block which overlaps the gate by a distance $D_E$ is advantageous as it effectively prevents formation of silicide in the underlying region and effectively prevents current to flow in the horizontal direction, leading to better ESD performance. The silicide block lines the top of the gate and extends partially over the drain region as shown in FIGS. 1a-b. Other configurations for the silicide block may also be useful. For example, the silicide block may extend over the entire top surface of the gate and the first S/D region. Such configuration improves the holding voltage.

A second well 165 is disposed in the substrate. The second well is disposed in the device region. For example, the second well is disposed within the first well. The second well serves as a body well for the transistors. A depth of the second well is shallower than the first well. For example, the depth of the second well is about 2~8 µm. Providing the second well with other depths may also be useful. The second device well includes second polarity dopants for a first polarity type device. For example, the second device well includes p-type dopants for an n-type device or n-type dopants for a p-type device. The second device well may be lightly ($x^-$) or intermediately (x) doped with first polarity type dopants. For example, the dopant concentration of the second well may be about $1E12~5E13/cm^3$. Other dopant concentration for the second device well may also be useful.

In one embodiment, a third well 180 is provided. The third well is disposed in the substrate within the second well. For example, a depth of the third well is shallower than a depth of the second well. In one embodiment, the depth or bottom of the third well is below the isolation regions. The depth of the third well may be about 1~3 µm. Other depths may also be useful. The depth, for example, may depend on the design voltage of the device. The third well serves as a low voltage (LV) well. The third device well includes second polarity dopants for a first polarity type device. For example, the third device well includes p-type dopants for an n-type device or n-type dopants for a p-type device. The third device well may be lightly ($x^-$) or intermediately (x) doped with first polarity type dopants. For example, the dopant concentration of the third well may be about $5E13~5E15/cm^3$. Other dopant concentration for the third device well may also be useful.

In one embodiment, the LV well 180 at least encompasses the first S/D region 130 and a part of the gate. Referring to FIGS. 1a-b, the LV well extends from the bottom of the isolation region 190 between the inner and outer edges of the isolation region which is adjacent to the first side 120a of the gate towards the gate. For example, a first side or edge 180a of the LV well is disposed below the bottom of the isolation region which is adjacent to the first side 120a of the gate while a second side or edge 180b of the LV well is disposed below and in between the first and second sides 120a-b of the gate. The second side 180b of the LV well, for example, is disposed below and in between the first and second sides 120a-b of the gate and does not extend beyond the second side 120b of the gate. The width of the LV well, for example, extends from the first edge 180a to the edge 180a to the second edge 180b. The width of the LV well, for example, is about 0.6~5 µm. The LV well may also include other suitable width dimensions. The LV well, for example, reduces the lateral NPN base resistance, leading to improved thermal runaway current ($It_2$).

Referring to FIGS. 1a-b, the body well 165, in one embodiment, encompasses the first S/D region 130 and at least a portion of the gate and is configured or narrowed so that the body well is away from the second S/D or drain region 140. The body well, in one embodiment, extends from the bottom of the isolation region between the inner and outer edges of the isolation region 190 which is adjacent to the first side 120a of the gate towards the second side 120b the gate as shown in FIG. 1a. Providing the body well which extends from about an inner edge of the device isolation region may also be useful. As illustrated in FIG. 1a, a first side or edge 165a of the body well is disposed below the bottom of the isolation region which is adjacent to the first side 120a of the gate while a second side or edge 165b of the body well is disposed below and anywhere in between the second side 120b of the gate and a first side 175a of a fourth well which will be described later.

The LV well 180, as shown in FIG. 1a, is narrower than or having the same width as the body well 165. In one embodiment, at least second edges of the LV and body wells adjacent to the second side of the gate, for example, are separated by a distance. As shown in FIG. 1a, the second edge 180b of the LV well and the second edge 165b of the body well are separated by a distance $D_O$. The distance $D_O$, for example, is about 0.1~5 µm with reference to the second edge 180b of the LV well. The distance $D_O$, for example, may be tuned or varied with reference to the edge 180b of the LV well. Other suitable distances for $D_O$ may also be useful, as long as the second edge 165b of the body well is not too close to the second S/D or drain region 140 to keep enough device breakdown voltage.

In another embodiment, the second edge 180b of the LV well is aligned with the second edge 165b of the body well as shown in FIG. 1b. The width of the body well, for example, extends from the first edge 165a to the second edge 165b. The width of the body well, for example, is about 0.6~5 µm. The body well may also include other suitable width dimensions. As shown, the distance L between the first S/D region 130 and the LV well correspond to the channel region of the transistor.

The third well, in one embodiment, is provided with a third well contact 167 for biasing the third well. The third well contact is a heavily doped region, similar to the S/D regions. For example, a depth of the third well contact is shallower than a depth of the device isolation region and the third well contact is in communication with the third well. The dopant concentration of the third well contact may be about $5E15~9E15/cm^3$. Other suitable concentration ranges may also be useful. The third well contact has the same polarity type as the third well. For example, the third well contact 167 is a second polarity type doped region.

In one embodiment, an isolation region 194 may be provided to separate the third well contact 167 with the first S/D region 130. The isolation region 194 may be STI region. For example, the isolation region may be similar to the device isolation regions. Other types or configurations of isolation regions may also be useful.

Metal silicide contacts (not shown) may be formed on the various contact regions. For example, metal silicide contacts may be provided over the S/D regions and the third well contact. The silicide contacts, for example, may be nickel-based contacts. Other types of metal silicide contacts may also be useful. For example, the silicide contacts may be cobalt silicide (CoSi) contacts. The silicide contacts may be about 100-500 Å thick. Other thickness of silicide contacts may also be useful. The silicide contacts may be employed to reduce contact resistance and facilitate contact to the back-end-of-line metal interconnects.

In one embodiment, the second well, the first S/D region and gate are commonly coupled to a first terminal 134 of the ESD device. The second S/D region is coupled to a second terminal 144 of the ESD device. For example, the first terminal is a source terminal and the second terminal is a drain terminal. In one embodiment, the third well contact 167 is also coupled to the first or source terminal. The source terminal, for example, is coupled to ground while the drain terminal, for example, is coupled to $V_{DD}$ or I/O pad. Other configurations of terminal connections to the ESD devices may also be useful.

In one embodiment, a fourth well 175 is provided. The fourth well, for example, serves as a second S/D or drain well. In one embodiment, the drain well is disposed within the first well in the substrate and encompasses the second S/D region.

The drain well, in one embodiment, is configured or extended so that the second edge 175b of the drain well extends towards and below the gate. In one embodiment, the first edge 175a of the drain well is aligned with or contacts an inner edge of the device isolation region which is adjacent to the second S/D region and underlaps a portion of the gate, creating a gate overlap region $O_{gate}$. The $O_{gate}$, for example, is between a second edge 175b of the fourth well under the gate and a second side of the gate. In one embodiment, $O_{gate}$ is about 0.1~5 μm. Providing other values of $O_{gate}$ may also be useful. In one embodiment, the width of the fourth well, in one embodiment, is larger than the width of the second S/D region 140 and third well 180.

In one embodiment, a depth of the fourth well is shallower than a depth of the third or LV well. For example, the depth of the fourth well is about 1~3 μm. Other depth dimensions may also be useful. The drain well 175 includes first polarity type dopants. In one embodiment, the drain well may be intermediately (x) doped with first polarity type dopants. For example, the dopant concentration of the drain well is about $5E13~5E15/cm^3$. Other suitable dopant concentrations may also be useful.

In one embodiment, unlike conventional ESD device, a drift well which is lightly ($x^-$) or intermediately (x) doped with first polarity type dopants is not provided. As such, the ESD device is devoid of a drift well. Without the drift well, the drain is coupled to the channel by the fourth or drain well 175. Such configuration improves the holding voltage.

We have discovered that providing the body well and the drain well with the configurations as described above result in advantages. The drain well 175, as shown in FIGS. 1a-b, is connected to the first device well 160, enabling major current to flow deep into the body well 165. This produces lateral NPN base width which is wider than the channel length. As a result, the holding voltage is increased, leading to improved latch up immunity.

Figure 2:
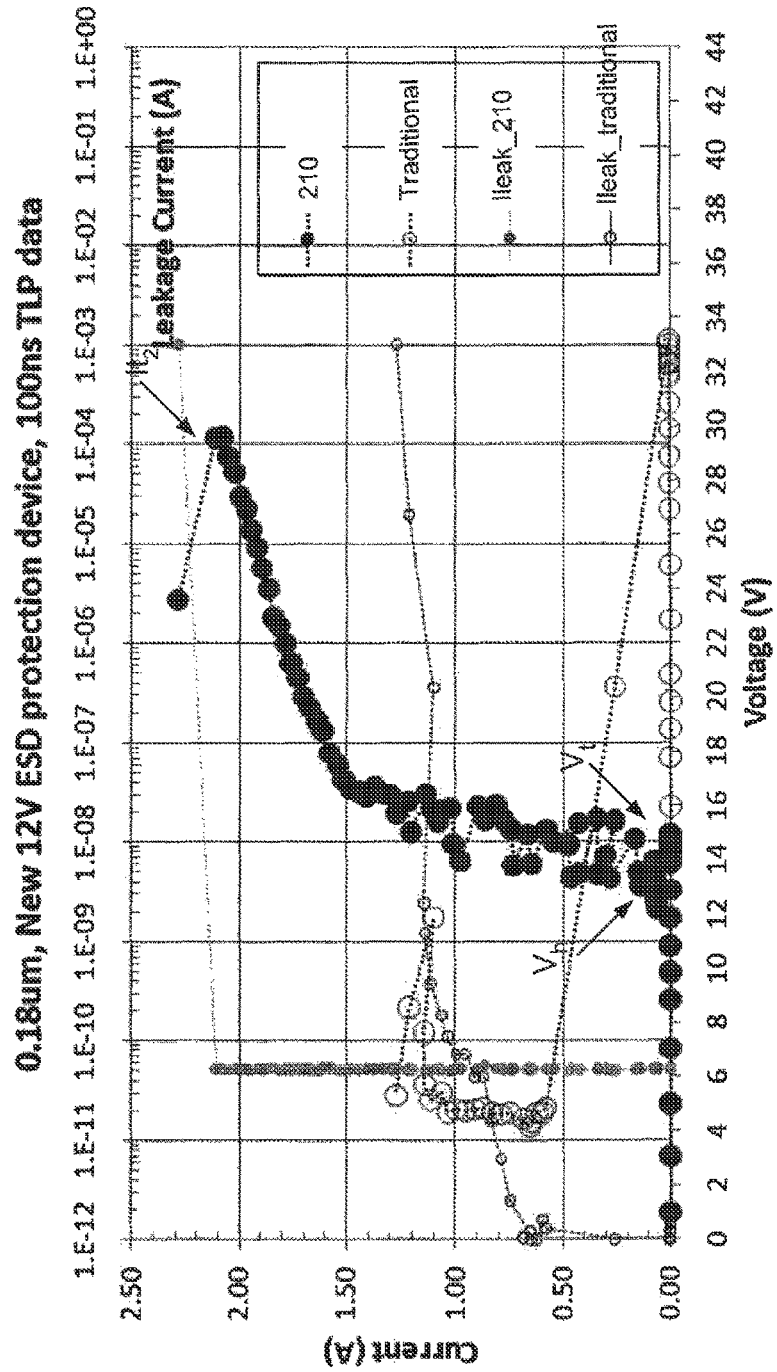
FIG. 2 shows comparison of the transmission line pulse (TLP measurement) of an embodiment of a device and the TLP measurement of a traditional LDMOS.

FIG. 2 shows a TLP measurement 210 of the embodiment of the ESD protection circuit as described in, for example, FIG. 1a. The embodiment of the ESD protection circuit, as described in FIG. 1, for example, is suitable for use in the 0.18 μm 12V Bipolar CMOS DMOS (BCD) process. As observed in the TLP measurement 210 of the LDMOS, the trigger voltage ($V_t$) is about 15 V while the thermal runaway current ($It_2$) which relates to the ESD performance of the LDMOS is about 2.1 A. In other words, when the device enters the snapback mode around 15 V, the device fails around 2.2 A for a given total width of 600 μm. Moreover, the snapback or holding voltage ($V_h$) of the LDMOS, as shown, is about 13 V, which is higher than the operation voltage of 12V. Since the holding voltage is larger than the operation voltage, the device does not suffer latch-up under latch-up testing. As such, the configuration as described above is effective to increase the ESD $It_2$ and $V_h$ capabilities. The increased in $It_2$ means that the device is capable of shunting greater amount of current before failure while the enhanced $V_h$ which is greater than the operation voltage of 12V shows that the latch up phenomena is eliminated. Accordingly, the ESD device based on the configuration above exhibits superior ESD performance and improved latch up immunity. Moreover, since the $V_h$ of the embodiment as described in FIG. 1 is about 13V which is higher than the operation voltage of 12V, it is suitable for use in, for example devices produced under the 8~12V BCD process.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

What is claimed is:

1. A device comprising:
   a substrate defined with a device region, the device region comprises an ESD protection circuit having a transistor, wherein the transistor is devoid of a drift well, the transistor includes
   a gate having first and second sides,
   a first diffusion region adjacent to the first side of the gate, and
   a second diffusion region displaced away from the second side of the gate,
   wherein the first and second diffusion regions comprise dopants of a first polarity type;
   a first device well encompasses the device region and a second device well disposed within the first device well, wherein the second device well encompasses the first diffusion region and at least a part of the gate without encompassing the second diffusion region;
   a third well disposed within the second device well; and
   a drain well encompasses the second diffusion region and extends below the gate.

2. The device of claim 1 wherein:
   the first device well comprises dopants of the first polarity type; and
   the second device well and third well comprise dopants of a second polarity type.

3. The device of claim 2 wherein the first polarity type comprises n type and the second polarity type comprises p type.

4. The device of claim 1 wherein the third well encompasses at least the first diffusion region and a part of the gate.

5. The device of claim 4 wherein the third well comprises a width which is narrower than a width of the second device well.

6. The device of claim 1 wherein the drain well comprises dopants of the first polarity type.

7. The device of claim 6 wherein the first polarity type comprises n type.

8. The device of claim 1 wherein the drain well is wider than the third well.

9. The device of claim 1 wherein a first edge of the third well is below a bottom of a device isolation region adjacent to the first side of the gate and a second edge of the third well is below and in between the first and second sides of the gate.

10. The device of claim 9 wherein:
    a first edge of the second device well is below the bottom of the device isolation region adjacent to the first side of the gate and a second edge of the second device well is below and in between the second side of the gate and a first side of the drain well; and
    wherein the second edge of the third well and the second edge of the second device well is separated by a distance $D_o$.

11. The device of claim 9 wherein a first edge of the second device well is below the bottom of the device isolation region adjacent to the first side of the gate and a second edge of the second device well is aligned with the second edge of the third well.

12. The device of claim 1 wherein the transistor comprises a silicide block overlapping the gate.

13. A device comprising:
a substrate defined with a device region, the device region comprises an ESD protection circuit having a transistor, wherein the transistor includes
a gate having first and second sides,
a first diffusion region adjacent to the first side of the gate, and
a second diffusion region displaced away from the second side of the gate,
wherein the transistor is devoid of a drift isolation region disposed between the gate and the second diffusion region;
a first device well encompasses the device region and a second device well disposed within the first device well, wherein the second device well encompasses the first diffusion region and at least a part of the gate;
a third well disposed within the second device well; and
a drain well having dopants of a first polarity type encompasses the second diffusion region and extends below the gate.

14. The device of claim 13 wherein:
the first device well comprises dopants of the first polarity type;
the second device well and third well comprise dopants of a second polarity type; and
the first and second diffusion regions comprise dopants of the first polarity type.

15. The device of claim 14 wherein the first polarity type comprises n type and the second polarity type comprises p type.

16. The device of claim 13 wherein the drain well underlaps a portion of the gate.

17. The device of claim 13 wherein a first edge of the third well is below a bottom of a device isolation region adjacent to the first side of the gate and a second edge of the third well is below and in between the first and second sides of the gate.

18. The device of claim 17 wherein:
a first edge of the second device well is below the bottom of the device isolation region adjacent to the first side of the gate and a second edge of the second device well is below and in between the second side of the gate and a first side of the drain well; and
wherein the second edge of the third well and the second edge of the second well is separated by a distance $D_o$.

19. The device of claim 17 wherein a first edge of the second device well is below the bottom of the device isolation region adjacent to the first side of the gate and a second edge of the second device well is aligned with the second edge of the third well.

20. The device of claim 13 wherein the transistor comprises a silicide block overlapping the gate, wherein the silicide block extends partially over the second diffusion region.

* * * * *